United States Patent [19]

Littlebury et al.

[11] Patent Number: 4,989,209
[45] Date of Patent: Jan. 29, 1991

[54] METHOD AND APPARATUS FOR TESTING HIGH PIN COUNT INTEGRATED CIRCUITS

[75] Inventors: Hugh W. Littlebury, Chandler; Mavin C. Swapp, Mesa, both of Ariz.

[73] Assignee: Motorola, Inc., Schaumburg, Ill.

[21] Appl. No.: 328,258

[22] Filed: Mar. 24, 1989

[51] Int. Cl.⁵ .............................................. G06F 11/00
[52] U.S. Cl. .................. 371/22.1; 371/25.1; 371/27
[58] Field of Search ............... 371/22.1, 22.3, 22.4, 371/22.5, 25.1, 27, 15.1; 324/73.1

[56]  References Cited

U.S. PATENT DOCUMENTS

| | | | |
|---|---|---|---|
| 4,287,594 | 9/1981 | Shirasaka | 371/25 |
| 4,348,759 | 9/1982 | Schnurmann | 371/20 |
| 4,517,661 | 5/1985 | Graf | 364/900 |
| 4,566,104 | 1/1986 | Bradshaw | 371/22.3 |
| 4,571,724 | 2/1986 | Belmondo | 371/22.1 |

OTHER PUBLICATIONS

M. Markowitz, "High-Density IC's Need Design-for-Test Methods", Electronic Design News, 11/1988, pp. 73–86.

Primary Examiner—Jerry Smith
Assistant Examiner—Robert W. Beausoliel
Attorney, Agent, or Firm—Joe E. Barbee; Stuart T. Langley

[57] ABSTRACT

An interface apparatus for coupling a multi-channel tester to a high pin count logic circuit for use in testing the logic circuit is provided wherein a plurality of terminal electronics units are coupled to each test channel of the multi-channel tester. Some of the terminal electronics units are coupled to each other in parallel by at least one stimulus shift register, which serves to divide a serial stimulus vector among the terminal electronics units, and one response shift register, which serve to assembly the response data from several terminal electronics units into a serial response vector. The serial stimulus vector is generated, and the serial response vector is analyzed by the multi-channel tester. The apparatus is capable of operating in one of a plurality of modes used for functional testing, parametric testing, and high speed scan path testing of the logic circuit.

12 Claims, 3 Drawing Sheets

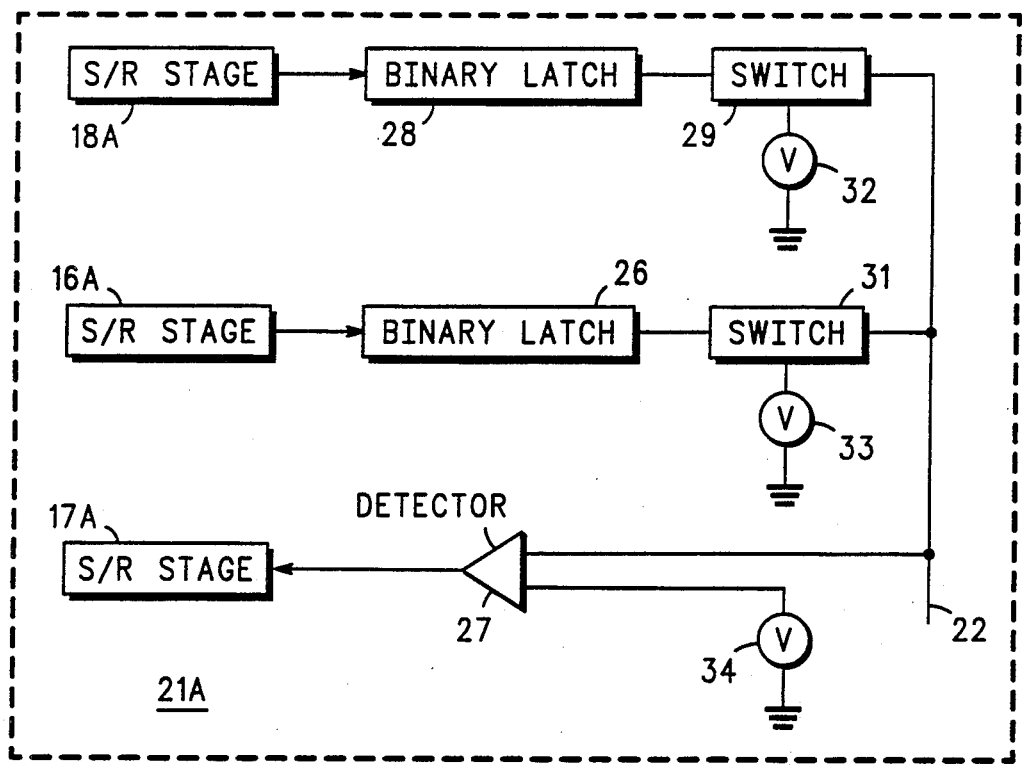
FIG. 2
FIG. 3
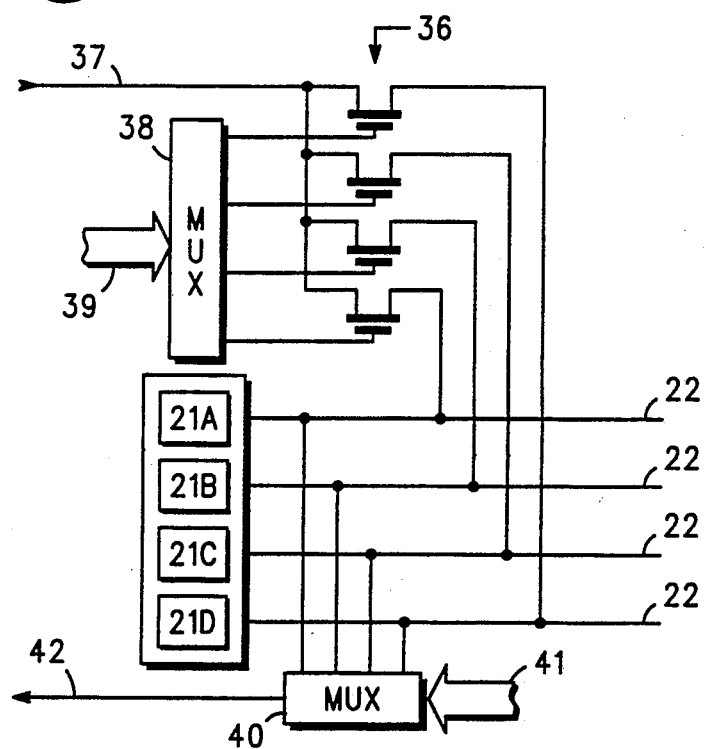

METHOD AND APPARATUS FOR TESTING HIGH PIN COUNT INTEGRATED CIRCUITS

BACKGROUND OF THE INVENTION

The present invention relates, in general, to automated digital test systems. More particularly, the invention relates to a method and apparatus for transferring data between a multi-channel tester and a logic circuit having more circuit terminals, or pins, than the number of test channels available.

Testing logic circuits, and specifically integrated circuits, is of prime importance to electronic circuit manufacturers so as to identify defective units before they are assembled and used. It is desirable to test integrated circuits before and after the circuits are packaged. The electronic industry is moving towards shrinking dimensions and increasing complexity of electronic circuits, which increases the number of pins needed to communicate with the circuits. As circuits become more complex, it becomes difficult or impossible to test the circuits on existing equipment. It is becoming important for testers to be able to support circuits with several hundred to more than one thousand terminals, while at the same time decreasing the cost of the test apparatus. Accordingly, methods for expanding the number of terminals that a single test channel can support have been developed to meet demands of new circuits.

Another trend in integrated circuit manufacture is towards application specific and customer designed circuits, resulting in a large variety of circuits, with various design rules, that must be tested. These added complexities can make the cost of testing a circuit account for a significant portion of the finished circuit cost. Also, testing has placed limitations on circuit design rules which often compromise circuit performance. Test apparatus must be increasingly flexible and able to support a wide variety of circuits with a minimum number of limitations placed on design of the circuit.

One area of particular interest is transferring test signals between the tester and the circuit under test. Each channel of a tester typically has multiple force and measure circuits, used for passing serial stimulus data from the tester to the circuit under test, and serial response data from the circuit under test to the tester. A pattern of stimulus signals, or stimulus vectors, is stored in a mass storage unit associated with the tester. Each terminal of the circuit under test is associated with a driver, used to force a logic signal on the terminal, and a comparator, used to detect a response voltage on the terminal, and output a response vector to the tester. The tester passes the stimulus vector to the force and measure circuit which control the drivers and comparators. In this manner, the stimulus vector is applied to the circuit under test and the response vector is recorded from the circuit under test. For circuits with a large number of pins, however, replication of force and measure circuits for each terminal becomes expensive. Also, new circuits with higher pin counts are developed more quickly than testers to evaluate them, thus manufacturers find themselves with test equipment having fewer test channels than the number of circuit terminals.

One solution to this problem was to include test circuitry as a part of the circuit under test. Several methods were used, but each is similar in that they required additional logic devices in the circuit and slowed circuit performance. One popular method, called boundary scan, comprised a chain of shift register latches coupled between each terminal of the logic circuit. In this method, the stimulus vector was passed from one test channel to all of the terminals of the circuit by shifting the vector along the chain of shift register latches. Upon receiving a strobe pulse from the tester, the shift register latches applied the stimulus vector to the circuit under test. In a like manner, the response vector was loaded into the shift register chain and shifted out of the circuit under test to the tester. Boundary scan techniques used only four terminals: stimulus vector in, response vector out, clock, and strobe. Test time using boundary scan, however, was multiplied by the number of terminals in the chain. Thus, for a 100 pin circuit, 100 clock pulses were required to transfer the stimulus vector to the circuit under test, and 100 clock pulses were required to transfer the response vector from the circuit under test to the tester, resulting in significant increase in test time for devices with large numbers of terminals. In addition, boundary scan circuitry added delay time to every input and output from the logic circuit when the logic circuit was in use. Finally, the boundary scan circuitry added up to 25% more chip area to a circuit, increasing cost of the logic circuit.

Another solution was to upgrade the tester to support more circuit terminals. This required test channels be multiplexed to support more than one terminal, or new equipment be purchased. Previous multiplexing methods were too slow and did not completely test the logic circuit. New equipment with more test channels is increasingly expensive, and usually not yet available when the manufacturer first produces circuits. Thus, there exists a need for a test apparatus that supports more than one circuit terminal with each test channel, as well as maintaining flexibility to fully test a variety of logic circuits, without imposing restrictions and limitations on the circuit to be tested.

Accordingly, it is an object of the present invention to provide a method and apparatus for transferring data between a tester and a logic circuit under test using a minimum number of components.

It is a further object of the present invention to provide a method and apparatus for transferring data between a tester and a logic circuit under test which is of minimal cost.

It is a further object of the present invention to provide a method and apparatus for transferring data between a tester and a logic circuit under test which can support more than one circuit terminal per test channel.

It is a further object of the present invention to provide a method and apparatus for transferring data between a tester and a logic circuit under test which allows a wide variety of logic circuits to be tested.

SUMMARY OF THE INVENTION

The above and other objects and advantages of the present invention are achieved by providing an apparatus for transferring data between a tester having a number of test channels and a logic circuit under test, the logic circuit having a number of terminals, wherein the number of terminals is significantly more than the number of test channels in the tester. The apparatus is capable of dividing stimulus data from one test channel among a subset of terminals of the logic circuit, and assembling response data from the subset of terminals and sending the response data to the test channel. The apparatus is further capable of operating in a functional test mode, a parametric test mode, and high speed scan test mode.

BRIEF DESCRIPTION OF THE DRAWINGS

FIG. 2 illustrates a block diagram of a single terminal electronics unit;

FIG. 3 illustrates a block diagram of a portion of the apparatus which allows parametric testing of some terminals of the circuit under test.

DETAILED DESCRIPTION OF THE DRAWINGS

In general, functional testing of logic circuits requires that a test signal, or stimulus vector, be applied to input pins of a circuit under test, and response data be detected from output pins of the circuit under test. The response data, or response vector, is compared by a tester to an expected response vector, which is stored in a tester memory with the stimulus vector. If discrepancies exist between the expected response vector and the response vector the circuit under test is defective. Stimulus vectors and response vectors usually comprise many thousands of bits of data. In addition to functional testing, it is often desirable to parametrically test some portions of the logic circuit. Also, the circuit under test may include some form of built in test circuitry, called a scan path, which the tester must evaluate. Therefore, an apparatus for transferring data between a tester and a circuit under test operates in a plurality of modes to accomplish functional, parametric, and scan path testing. Modern testers comprise a number of test channels each of which is capable of functional, parametric, and scan path testing of one terminal of the circuit under test.

Figure 1:
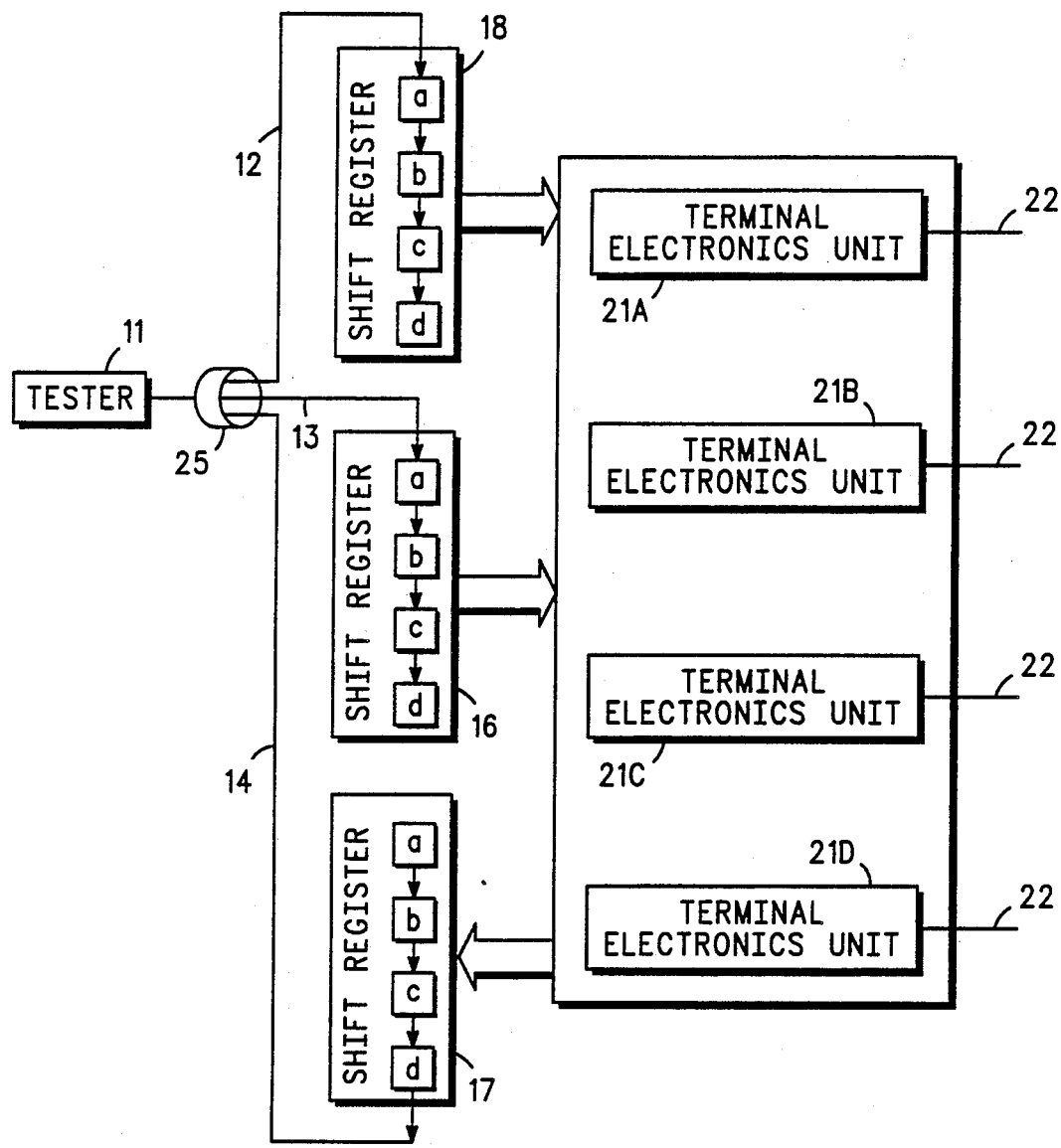
FIG. 1 illustrates a block diagram of one segment of an apparatus coupled in series to a single tester channel.

FIG. 1 illustrates one segment of an apparatus which is coupled to tester 11 via test channel 25. The apparatus serves to interface between tester 11 and a circuit under test, thereby greatly increasing the number of pins or terminals 22 that tester 11 can support. Test channel 25 comprises multiple data lines such as 12, 13 and 14, for transferring data between tester 11 and pins 22 of the circuit under test. In a preferred embodiment tester 11 has sixty-four test channels 25, though it should be understood that any number of test channels 25 is possible. Each test channel of tester 11 is coupled to a segment of the apparatus similar to that shown in FIG. 1. Input line 12 carries serial stimulus data to a serial input of shift register 18. Shift register 18 comprises a number of stages 18a, 18b, 18c, 18d, and is controlled by a clock signal from tester 11, wherein when a clock signal is received one bit of the stimulus data is shifted from stimulus data line 12 into shift register 18 and data shifted simultaneously from 18a to 18b, 18b to 18c and 18c to 18d.

It should be noted that shift register 18 is illustrated as comprising four stages, that is to say shift register 18 is shown as a four bit shift register, but that any number of bits may be incorporated into shift register 18. In a preferred embodiment, shift register 18 comprises sixteen stages and therefore each segment would have sixteen terminal electronics units and output to sixteen terminals 22. The pins or terminals 22 associated with each segment, such as illustrated in FIG. 1, are called a subset of terminals.

When enough stimulus data is loaded into shift register 18 to fill all the stages, a strobe signal is sent from tester 11 to terminal electronic units 21a-21d, causing transfer of data from shift register 18 to terminal electronics units 21a-21d. The transfer takes place so that data which is stored in shift register stage 18a is transferred to terminal electronics unit 21a; 18b to 21b; etc.

Second stimulus data line 13 is shown coupled in parallel with stimulus data line 12. At least one stimulus data line is required to stimulate the circuit under test but any number may be used in order to apply a wider variety of stimulus signals to the circuit under test. Using binary logic, n stimulus data lines can define up to $2^n$ unique stimulus signals. Shift register 16 operates in an analogous fashion to shift register 18, and data is transferred from 16a to terminal electronics unit 21a, 16b to 21b, etc. when the strobe signal is sent from tester 11.

Terminal electronics units 21a-21d are coupled to parallel inputs of shift register 17. A serial output of shift register 17 is coupled to tester 11 by response data line 14. The function of shift register 17 and response data line 14 will be disclosed in greater detail hereinafter.

FIG. 2 illustrates a block diagram of a single terminal electronics unit 21a. A terminal electronics unit similar to 21a is associated with each terminal 22 of the circuit under test. For clarity, FIG. 2. illustrates only terminal electronics unit 21a, but it should be understood each terminal electronics unit is coupled in a similar fashion to a corresponding shift register 18, shift register 16, and circuit terminal 22. In a preferred embodiment the stimulus signal comprises a high logic signal, a low logic signal, and a tri-state or a high impedance signal, thus two stimulus vectors are required to realize the three stimulus signals. Shift register cell 18a transfers data corresponding to the logic high stimulus, while shift register cell 16a transfers data corresponding to the logic tri-state stimulus. Data is transferred from shift register cell 18a to binary latch 28 when binary latch 28 receives the strobe signal from tester 11. Latch 28 holds the data on a binary output until another strobe signal is received from tester 11. The binary output of latch 28 controls switch 29, which serves to couple a logic high reference voltage 32 to circuit terminal 22 when logic high data is received from binary latch 28. When shift register 28 contains logic low data switch 29 is not activated and is placed in a high impedance state. Binary latch 26 receives and stores stimulus data in a similar fashion to binary latch 28. The output of binary latch 26 controls switch 31, which couples a logic low reference voltage 33 to terminal 22 when logic low data is received from binary latch 26. When logic high data is stored in binary latch 26 switch 31 is in a high impedance state. In this manner it is possible to stimulate circuit under test terminal 22 with a logic high signal, logic low signal, or high impedance or tristate signal.

In operation, if a terminal 22 is an input terminal, a series of logic high and logic low signals are applied to that terminal. The stimulus vector for an output terminal, however, holds only tri-state data, which causes switch 29 and switch 31 to be placed in a high impedance state for that terminal. Thus the output terminal is terminated with a high impedance and a voltage on the output terminal is a response voltage of the logic circuit under test. The response voltage is coupled to comparator 27 which compares the response voltage to reference voltage 34. Reference voltage 34 is set somewhere between a logic low and a logic high reference voltage. In this manner an output of comparator 27 is a logic high if the response voltage is a logic high and is a logic low if the response voltage is a logic low. The output of comparator 27 is coupled to output shift register stage 17a.

Referring again to FIG. 1 response data from each terminal electronics unit 21a-21d is coupled to output shift register 17, wherein each stage 17a-17d of output shift register 17 corresponds to one terminal 22 of the circuit under test. Output shift register 17 is controlled by the clock signal from tester 11. Response data is transferred from 17a to 17b to 17c to 17d, and finally the response data is passed serially to tester 11 on response line 14.

Shift registers 16, 17, and 18 must each comprise the same number of stages, and each section must include the same number of terminal electronics units 21a-21d as the number of stages in shift registers 16, 17, and 18. Thus, when the circuit is operating in a first of a plurality of modes, serial stimulus data is transferred to shift registers 18 and 16 and converted to parallel stimulus data, the parallel stimulus data is transferred to terminal electronics units 21a-21d which drive circuit terminals 22. A response voltage is generated by the circuit under test and detected from circuit terminals 22 and passed in parallel form to output shift register 17, which converts the parallel response data to serial response data. Serial response data is then transferred to tester 11 for analysis. This cycle is repeated until functional testing of the circuit under test is completed. In this manner, a tester having sixty-four test channels, each test channel coupled to one segment of the apparatus and each segment supporting sixteen terminals, is capable of functionally testing a circuit with 64×16 or 1024 terminals.

FIG. 3 illustrates a block diagram of additional circuitry which cooperates with circuitry shown in FIG. 1 and FIG. 2, and which is activated when the apparatus is operating in a second of the plurality of modes. The circuitry shown in FIG. 3 allows parametric measurements to be made on one terminal of the set of terminals 22. In addition, another of the terminals 22, can be stimulated with a precision power supply (not shown) which is housed in tester 11. The precision power supply is coupled to the segment of the apparatus by stimulus data line 37. In this manner parametric information can be gathered about the circuit under test.

When the apparatus is operating in the second mode, terminal electronics units 21a-21d are activated as previously described and hold a logic signal on terminals 22. The logic stimulus signal on the circuit terminals is held constant while the parametric measurement is made. A precision power supply which is capable of supplying voltage or current is provided for each test channel 25 of tester 11. Stimulus data line 37 is coupled to one side of a set of field effect transistor (FET) switches 36. The set of FET switches 36 is controlled by multiplexer 38, which is controlled by terminal selection data 39 from tester 11. Multiplexer 38 selects one FET switch 36 of the set of FET switches 36. Each FET switch 36 is coupled to one terminal 22 of the circuit under test, wherein when FET switch 36 is activated by multiplexer 38 the precision power supply is coupled to one terminal of the terminals 22. Measurement multiplexer 40 has one input coupled to each terminal of the terminals 22. Multiplexer 40 is controlled by terminal selection data 41 from tester 11. One terminal of the terminals 22 is selected, and data from that terminal is transferred to parametric measurement line 42 and sent to tester 11.

In normal operation stimulus data will be transferred to the circuit under test via circuitry shown in FIG. 1 and FIG. 2 for a number of cycles, bringing the circuit under test to a known state. Terminal electronics unit 21 maintains the stimulus data on circuit terminals 22 for a period of time in which the circuitry shown in FIG. 3 is activated. During this time period at least one terminal 22 corresponding to an input terminal is stimulated by the precision power supply, and at least one terminal 22 corresponding to an output terminal is coupled to the parametric measurement circuit via multiplexer 40 and parametric measurement line 42. Once the parametric measurement is complete multiplexer 38 and 40 disconnect the parametric measurement circuit of tester 11 from circuit terminals 22, and the apparatus once again functions in the first mode by transferring data using the electronics shown in FIG. 1 and FIG. 2.

Figure 4:
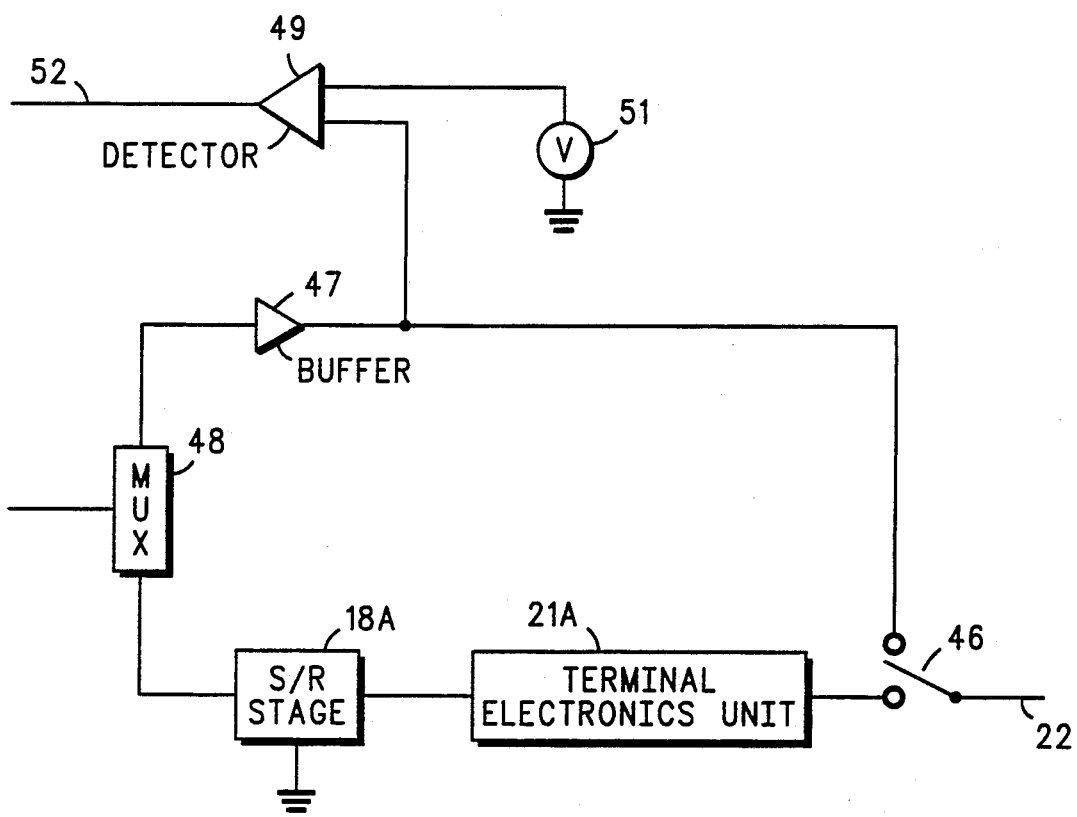
FIG. 4 illustrates a block diagram of a portion of the apparatus which allows for high speed testing of one terminal of the circuit under test for each test channel.

FIG. 4 shows additional circuitry which cooperates with circuitry shown in FIGS. 1, FIG. 2 and FIG. 3. The additional circuitry shown in FIG. 4 allows for relatively high speed testing of one terminal of the terminals 22. Switch 46 is coupled to at least one of the set of terminals 22. When switch 46 is activated by a control signal from tester 11, corresponding terminal 22 is disconnect from both terminal electronics unit 21 and the circuitry in FIG. 3. When switch 46 is activated the apparatus will operate in a third of the plurality of modes, wherein high speed scan path testing is performed. When switch 46 is activated multiplexer 48 is also activated so as to direct stimulus data from stimulus line 12 to buffer 47. An output of buffer 47 is coupled to switch 46 and thus to terminal 22. In this manner stimulus data from serial stimulus line 12 is coupled to only one terminal of the set of terminals 22, and a rapid succession of stimulus data may be applied to terminal 22. If terminal 22 is an output terminal no stimulus data is applied to buffer 47 and a high impedance signal is held on terminal 22, in which case the voltage on terminal 22 is to the response voltage generated by the circuit under test. Detector 49 compares the response voltage on terminal 22 to reference voltage 51, which is a voltage somewhere between a logic low and a logic high reference voltage. Detector 49 outputs a serial response signal on serial response line 52 to tester 11. In this manner serial response data may be rapidly applied to one terminal 22 of the set of terminals 22, and serial response data may be rapidly collected and returned to tester 11. The response data is then compared to the expected pattern in tester 11, and a fail/pass decision is made.

By now it should be appreciated that an improved method and apparatus for transferring data between a multi-channel digital circuit tester and a circuit under test has been provided, wherein the apparatus uses fewer components for each terminal of the circuit under test resulting in a lower cost tester, and allows a single test channel to test a plurality of terminals of a circuit under test. The apparatus provided imposes no restrictions on the logic circuit under test, allowing for a variety of circuits to be tested by changing only a storage stimulus vector. The apparatus provided can operate in a plurality of modes and is able to accomplish functional testing as well as parametric testing and high speed testing of the logic circuit under test.

We claim:

1. An apparatus for transferring test data and response data between a multi-channel tester and a logic circuit under test, the apparatus capable of operating in one of a plurality of modes, the logic circuit having a plurality of terminals, each terminal of the plurality of terminals is an input or an output depending on internal configuration of the logic circuit, the apparatus comprising: a plurality of segments which are similar to each other, each segment coupled between one test channel of the multi-channel tester and a subset of terminals of the circuit under test, wherein the test channel provides serial stimulus data to the segment and analyzes serial response data from the segment, each segment including a first converter means having a serial input and a plurality of parallel outputs for dividing the serial stimulus data among the subset of terminals when the apparatus is operating in a first of the plurality of modes, a second converter means having a plurality of parallel inputs and a serial output for assembling response data from the subset of terminals to form the serial response data and sending the serial response data to the tester, and a plurality of terminal electronic units which are similar to each other connected to each logic circuit terminal, the terminal electronic units further comprising a latching means to temporarily store the divided stimulus data from the first converter means, a means to force a logic signal on an input logic circuit terminal controlled by the divided stimulus data stored in the latching means, a comparator to compare a response voltage at an output terminal to a reference voltage and output the response data to the second converter means.

2. The apparatus of claim 1 wherein each segment further comprises: a first multiplexer used for coupling a precision power supply to one terminal of the subset of terminals, the at least one input multiplexer being controlled by a control signal from the tester; a second multiplexer used for selecting data on one of the subset of terminals and sending the data to a parametric measurement circuit in the tester, the second multiplexer being controlled by the control signal from the tester, whereby when the apparatus is operating in a second of the plurality of modes parametric data is measured from one terminal of the subset of terminals.

3. The apparatus of claim 1 wherein each segment further comprises: a buffer, having a serial input and a serial output, for conditioning the serial stimulus data from the tester; a switching means coupled to a terminal of the subset of terminals, the switching means being controlled by the tester and activated when the apparatus is in a third mode of the plurality of modes, the switching means capable of disconnecting the terminal from the means to force a logic signal and coupling the terminal to an output of the buffer; a first multiplexer used for directing the serial stimulus data from the test channel to the input of the buffer; and a detector, having a serial input and a serial output, for detecting output data from the logic circuit and sending the serial response signal; the switching means further capable of disconnecting the terminal from the comparator and connecting the terminal to the detector.

4. The apparatus of claim 1 wherein the means to force a logic signal is further capable of forcing a logic high voltage, a logic low voltage, and a high impedance condition on the terminal of the circuit under test.

5. The apparatus of claim 1 wherein the subset of terminals comprises sixteen terminals, and each segment comprises sixteen terminal electronics units.

6. The apparatus of claim 1 wherein the first converter means and the second converter means comprise shift registers.

7. The apparatus of claim 5 further comprising sixty four electronic segments, the apparatus being capable of testing circuits with 1024 terminals.

8. The apparatus of claim 3 wherein the apparatus is operated in the first mode for a plurality of cycles in order to bring the logic circuit to a known state, and subsequently operated in the third mode to evaluate the logic circuit's speed of operation.

9. An apparatus for interfacing between a tester and an integrated circuit comprising: a first shift register having a serial input and a plurality of parallel outputs, the serial input coupled to one test channel; a plurality of binary latches, each latch coupled to one of the parallel outputs of the first shift register; a plurality of switches, controlled by the binary latches, used to couple a logic reference signal to each terminal of the integrated circuit; a plurality of comparators, each comparator coupled to one terminal of the integrated circuit, used to detect a response voltage at the terminal; a second shift register having a plurality of parallel inputs and a serial output, each of the parallel inputs coupled to one comparator, and the serial output coupled to the one test channel.

10. The apparatus of claim 9 wherein the logic reference signal comprises a logic high state, a logic low state, and a high impedance state.

11. The apparatus of claim 10 further comprising two first shift registers, each first shift register Coupled to the test channel and having a plurality of parallel outputs, each first shift register being associated with a set of the binary latches which control the plurality of switches, wherein one of the first shift registers transfers data indicating a logic high stimulus, and the other of the first shift registers transfers stimulus data indicating a high impedance stimulus.

12. A method of coupling an integrated circuit having a plurality of terminals to a multi-channel tester, each channel providing a serial stimulus signal and analyzing a serial response signal, comprising the steps of: converting the serial stimulus signal to a parallel stimulus signal; storing the parallel stimulus signal in a binary latch, wherein the binary latch has one output associated with each terminal of the integrated circuit; generating a logic signal which is a function of the output of the binary latch; and detecting a response signal from each terminal of the plurality of terminals; assembling the response signals from a set of the plurality of terminals to form the serial response signal.

* * * * *